(12) United States Patent
Chen et al.

(10) Patent No.: US 8,659,092 B2
(45) Date of Patent: Feb. 25, 2014

(54) COMPLEMENTARY METAL OXIDE SEMICONDUCTOR TRANSISTOR AND FABRICATING METHOD THEREOF

(75) Inventors: Chung-Tao Chen, Taipei (TW); Ta-Wei Chiu, Changhua County (TW); Yu-Pu Lin, Hsinchu (TW); Yi-Wei Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 459 days.

(21) Appl. No.: 12/943,006

(22) Filed: Nov. 10, 2010

(65) Prior Publication Data

US 2012/0025320 A1    Feb. 2, 2012

(30) Foreign Application Priority Data

Jul. 30, 2010  (TW) ................ 99125379 A

(51) Int. Cl.
    *H01L 27/092*      (2006.01)
(52) U.S. Cl.
    USPC .......................................... 257/369; 438/213
(58) Field of Classification Search
    USPC ........... 257/369, E27.064, E21.611, E21.612; 438/99, 212, 213
    See application file for complete search history.

(56) References Cited

U.S. PATENT DOCUMENTS

| | | | |
|---|---|---|---|
| 5,633,175 A * | 5/1997 | Kikuchi et al. | 438/30 |
| 6,628,363 B1 | 9/2003 | Sano et al. | |
| 7,544,967 B2 | 6/2009 | Kim et al. | |
| 2006/0292763 A1* | 12/2006 | Hwang et al. | 438/154 |
| 2009/0035899 A1* | 2/2009 | Herman et al. | 438/151 |
| 2009/0127551 A1 | 5/2009 | Imai | |
| 2010/0264410 A1* | 10/2010 | Nomoto et al. | 257/40 |

FOREIGN PATENT DOCUMENTS

TW    200917419    4/2009

* cited by examiner

*Primary Examiner* — Howard Weiss
*Assistant Examiner* — Sue Tang
(74) *Attorney, Agent, or Firm* — Jianq Chyun IP Office

(57) ABSTRACT

A fabricating method of CMOS transistor includes following steps. A first gate and a second gate are formed on a substrate. A gate insulator is formed on the substrate to cover the first and second gates. A first source, a first drain, a second source, and a second drain are formed on the gate insulator. The first source and the first drain are above the first gate. The second source and the second drain are above the second gate. A first channel layer and a mask layer are formed on the gate insulator. The mask layer is on the first channel layer. The first channel layer is above the first gate and contacts with the first source and the first drain. A second channel layer is formed on the gate insulator. The second channel layer is above the second gate and contacts with the second source and the second drain.

12 Claims, 18 Drawing Sheets

COMPLEMENTARY METAL OXIDE SEMICONDUCTOR TRANSISTOR AND FABRICATING METHOD THEREOF

CROSS-REFERENCE TO RELATED APPLICATION

This application claims the priority benefit of Taiwan application serial no. 99125379, filed on Jul. 30, 2010. The entirety of the above-mentioned patent application is hereby incorporated by reference herein and made a part of this specification.

BACKGROUND OF THE INVENTION

1. Field of the Invention

The invention relates to a complementary metal oxide semiconductor (CMOS) transistor and a fabricating method thereof. More particularly, the invention relates to a CMOS thin film transistor (TFT) and a fabricating method thereof.

2. Description of Related Art

Due to the rising consciousness of environmental protection, flat display panels featuring low power consumption, optimal space utilization, no radiation, and high image quality have gradually become the mainstream products of the market. Common flat panel displays include liquid crystal displays (LCD), plasma displays, organic electroluminescent displays, and so forth. The most common LCD, for instance, is mainly comprised of a TFT array substrate, a color filter substrate, and a liquid crystal layer sandwiched between the two substrates. In the conventional TFT array substrate, the amorphous silicon (a-Si) TFT or the low temperature polysilicon (LTPS) TFT often serves as the switch device of each sub-pixel. According to the recent researches, the amorphous oxide TFT has greater mobility than the a-Si TFT and has the superior threshold voltage variation than the LTPS TFT due to no grain boundary effects. Accordingly, the oxide TFT has great potential for becoming the key element of the next-generation flat panel display.

In the TFT array substrate, both a p-type TFT and an n-type TFT, forming the CMOS circuits, an output buffer, a shift register, or other driving circuits et al., need to be formed on the TFT array substrate in order to reduce power consumption. By forming the p-type TFT and the n-type TFT at the same time, the system-on-glass (SOG) concept, i.e. forming system circuits on the glass substrate, can be accomplished. The p-type or n-type semiconductor characteristics of the oxide TFT are determined based on the material of the channel layer, which is different from the LTPS TFT whose n-type or p-type TFT characteristics are determined by ion implantation. When the p-type channel layer of the p-type oxide TFT is in contact with the n-type channel layer of the n-type oxide TFT in the manufacturing process, the p-type channel layer and the n-type channel layer may affect each other. As such, the inherent semiconductor characteristics of the p-type channel layer and the n-type channel layer are changed. Besides, when one of the p-type and n-type oxide TFTs is etched, the other, if coming into contact with the etchant, may be damaged. Accordingly, how to mitigate or even prevent mutual influence between the p-type channel layer and the n-type channel layer is one of the main issues to be resolved by people skilled in the art.

SUMMARY OF THE INVENTION

The invention is directed to a fabricating method of a CMOS transistor to effectively prevent mutual influence between an n-type semiconductor layer and a p-type semiconductor layer in a manufacturing process and further assure reliability of the CMOS transistor device.

The invention provides a fabricating method of a CMOS transistor. The fabricating method includes following steps. A first gate and a second gate are formed on a substrate. A gate insulator is formed on the substrate to cover the first gate and the second gate. A first source, a first drain, a second source, and a second drain are formed on the gate insulator. The first source and the first drain are located above the first gate. The second source and the second drain are located above the second gate. A first channel layer and a mask layer are formed on the gate insulator. The mask layer is located on the first channel layer. The first channel layer is located above the first gate and is in contact with the first source and the first drain. A second channel layer is formed on the gate insulator. The second channel layer is located above the second gate and is in contact with the second source and the second drain.

According to an embodiment of the invention, the first gate and the second gate are formed by one photolithography and etching process.

According to an embodiment of the invention, the first source, the first drain, the second source, and the second drain are formed by one photolithography and etching process.

According to an embodiment of the invention, a method of forming the first channel layer and the mask layer includes sequentially teaming a first channel material layer and a mask material layer on the gate insulator, the first source, the first drain, the second source, and the second drain and patterning the mask material layer and the first channel material layer to form the mask layer and the first channel layer.

According to an embodiment of the invention, a method of forming the second channel layer includes forming a second channel material layer on the mask layer, the first channel layer, the gate insulator, the first source, the first drain, the second source, and the second drain and patterning the second channel material layer to form the second channel layer.

According to an embodiment of the invention, the fabricating method further includes removing the mask layer after patterning the second channel material layer.

According to an embodiment of the invention, the fabricating method further includes forming a passivation layer that covers the first channel layer, the second channel layer, the gate insulator, the first source, the first drain, the second source, and the second drain; patterning the passivation layer to form a plurality of first contact holes and a plurality of second contact holes in the passivation layer; forming a plurality of first contact conductors and a plurality of second contact conductors on the passivation layer. The first contact holes expose the first source and the first drain, and the second contact holes expose the second source and the second drain. The first contact conductors are electrically connected to the first source and the first drain through the first contact holes, and the second contact conductors are electrically connected to the second source and the second drain through the second contact holes.

According to an embodiment of the invention, the fabricating method further includes forming a passivation layer that covers the mask layer, the first channel layer, the second channel layer, the gate insulator, the first source, the first drain, the second source, and the second drain.

According to an embodiment of the invention, the fabricating method further includes patterning the passivation layer to form a plurality of first contact holes and a plurality of second contact holes in the passivation layer and forming a plurality of first contact conductors and a plurality of second contact conductors on the passivation layer. The first contact holes expose the first source and the first drain, and the second contact holes expose the second source and the second drain. The first contact conductors are electrically connected to the first source and the first drain through the first contact holes, and the second contact conductors are electrically connected to the second source and the second drain through the second contact holes.

According to an embodiment of the invention, a material of the first channel layer includes an n-type oxide semiconductor, and a material of the second channel layer includes a p-type oxide semiconductor.

According to an embodiment of the invention, a material of the first channel layer includes a p-type oxide semiconductor, and a material of the second channel layer includes an n-type oxide semiconductor.

According to an embodiment of the invention, a material of the first channel layer includes an inorganic semiconductor, and a material of the second channel layer includes an organic semiconductor.

According to an embodiment of the invention, a material of the first channel layer includes an organic semiconductor, and a material of the second channel layer includes an inorganic semiconductor.

The invention further provides another fabricating method of a CMOS transistor. The fabricating method includes following steps. A first gate and a second gate are formed on a substrate. A gate insulator is formed on the substrate to cover the first gate and the second gate. A first channel layer and a mask layer are formed on the gate insulator. The mask layer is located on the first channel layer, and the first channel layer and the mask layer are located above the first gate. A second channel layer is formed on the gate insulator, and the second channel layer is located above the second gate. The mask layer is removed. A first source, a first drain, a second source, and a second drain are formed. The first source and the first drain are in contact with the first channel layer, and the second source and the second drain are in contact with the second channel layer.

According to an embodiment of the invention, the first gate and the second gate are formed by one photolithography and etching process.

According to an embodiment of the invention, a method of forming the first channel layer and the mask layer includes sequentially forming a first channel material layer and a mask material layer on the gate insulator and patterning the mask material layer and the first channel material layer to form the mask layer and the first channel layer.

According to an embodiment of the invention, a method of forming the second channel layer and the mask layer includes forming a second channel material layer on the mask layer, the first channel layer, and the gate insulator and patterning the second channel material layer to form the second channel layer. The mask layer is removed at the time when the second channel material layer is patterned.

According to an embodiment of the invention, the first source, the first drain, the second source, and the second drain are formed by one photolithography and etching process.

According to an embodiment of the invention, the fabricating method further includes forming a passivation layer that covers the first channel layer, the second channel layer, the gate insulator, the first source, the first drain, the second source, and the second drain.

According to an embodiment of the invention, the fabricating method further includes patterning the passivation layer to form a plurality of first contact holes and a plurality of second contact holes in the passivation layer and forming a plurality of first contact conductors and a plurality of second contact conductors on the passivation layer. The first contact holes expose the first source and the first drain, and the second contact holes expose the second source and the second drain. The first contact conductors are electrically connected to the first source and the first drain through the first contact holes, and the second contact conductors are electrically connected to the second source and the second drain through the second contact holes.

According to an embodiment of the invention, a material of the first channel layer includes an n-type oxide semiconductor, and a material of the second channel layer includes a p-type oxide semiconductor.

According to an embodiment of the invention, a material of the first channel layer includes a p-type oxide semiconductor, and a material of the second channel layer includes an n-type oxide semiconductor.

According to an embodiment of the invention, a material of the first channel layer includes an inorganic semiconductor, and a material of the second channel layer includes an organic semiconductor.

According to an embodiment of the invention, a material of the first channel layer includes an organic semiconductor, and a material of the second channel layer includes an inorganic semiconductor.

The invention further provides another fabricating method of a CMOS transistor. The fabricating method includes following steps. A first channel layer is formed on a substrate. A bottom gate, a first source, and a first drain are formed on a substrate. The first source and the first drain are in contact with the first channel layer. A gate insulator is formed on the substrate to cover the bottom gate, the first source, and the first drain. A second channel layer is formed on the gate insulator. The second channel layer is located above the bottom gate. A top gate, a second source, and a second drain are formed on the gate insulator. The top gate is located above the first channel layer, and the second source and the second drain are in contact with the second channel layer.

According to an embodiment of the invention, the bottom gate, the first source, and the first drain are fowled by one photolithography and etching process.

According to an embodiment of the invention, the top gate, the second source, and the second drain are formed by one photolithography and etching process.

According to an embodiment of the invention, the fabricating method further includes forming a passivation layer that covers the second channel layer, the gate insulator, the second source, the second drain, and the top gate.

According to an embodiment of the invention, the fabricating method further includes patterning the passivation layer to form a plurality of first contact holes in the passivation layer and the gate insulator, forming a plurality of second contact holes in the passivation layer, and forming a plurality of first contact conductors and a plurality of second contact conductors on the passivation layer. The first contact holes expose the first source and the first drain, and the second contact holes expose the second source and the second drain. The first contact conductors are electrically connected to the first source and the first drain through the first contact holes, and the second contact conductors are electrically connected to the second source and the second drain through the second contact holes.

According to an embodiment of the invention, a material of the first channel layer includes an n-type oxide semiconductor, and a material of the second channel layer includes a p-type oxide semiconductor.

According to an embodiment of the invention, a material of the first channel layer includes a p-type oxide semiconductor, and a material of the second channel layer includes an n-type oxide semiconductor.

According to an embodiment of the invention, a material of the first channel layer includes an inorganic semiconductor, and a material of the second channel layer includes an organic semiconductor.

According to an embodiment of the invention, a material of the first channel layer includes an organic semiconductor, and a material of the second channel layer includes an inorganic semiconductor.

According to an embodiment of the invention, the first channel layer is formed before the first source and the first drain are formed.

According to an embodiment of the invention, the second channel layer is formed before the second source and the second drain are formed.

According to an embodiment of the invention, the first channel layer is formed after the first source and the first drain are formed.

According to an embodiment of the invention, the second channel layer is formed after the second source and the second drain are formed.

The invention further provides a CMOS transistor including a substrate, a first gate, a second gate, a gate insulator, a first source, a first drain, a second source, a second drain, a first channel layer, a mask layer, and a second channel layer. The first gate and the second gate are disposed on the substrate. The gate insulator is disposed on the substrate to cover the first gate and the second gate. The first source, the first drain, the second source, and the second drain are disposed on the gate insulator. The first source and the first drain are located above the first gate. The second source and the second drain are located above the second gate. The first channel layer is disposed on the gate insulator, and the mask layer is disposed on the first channel layer. The first channel layer is located above the first gate and is in contact with the first source and the first drain. The second channel layer is disposed on the gate insulator. The second channel layer is located above the second gate and is in contact with the second source and the second drain.

The mutual influence between the n-type semiconductor layer and the p-type semiconductor layer can be effectively prevented in the manufacturing process according to the invention, and therefore reliability and favorable electrical characteristics of the CMOS transistor device can be guaranteed in this invention.

It is to be understood that both the foregoing general descriptions and the following detailed embodiments are exemplary and are, together with the accompanying drawings, intended to provide further explanation of technical features and advantages of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
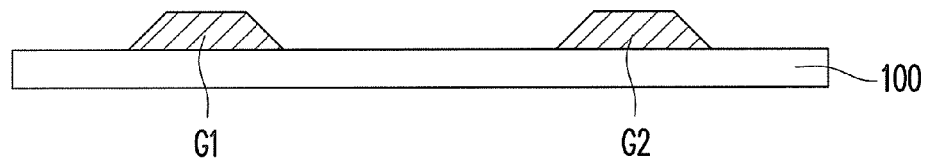
FIG. 1A to FIG. 1H are schematic cross-sectional views showing a process of fabricating a CMOS transistor according to a first embodiment of the invention.

FIG. 1A to FIG. 1H are schematic cross-sectional views showing a process of fabricating a CMOS transistor according to a first embodiment of the invention. As shown in FIG. 1A, a first gate G1 and a second gate G2 are formed on a substrate 100. In this embodiment, the first gate G1 and the second gate G2 are formed by one photolithography and etching process, and the etchant is, for instance, chlorine/oxygen ($Cl_2/O_2$), sulfur hexafluoride ($SF_6$), or $BCl_3/Cl_2$. Besides, the first gate G1 and the second gate G2 are, for instance, a molybdenum (Mo) metal layer or a titanium (Ti)/aluminum (Al)/titanium (Ti) metal stacked layer. Certainly, the first gate G1 and the second gate G2 can be formed by other single-layered or multi-layered conductive materials in this invention. Note that fabrication of the gates, the scan lines, and/or the common wires in pixel regions and fabrication of the first and second gates G1 and G2 can be integrated in the existing manufacturing process of the TFT array substrate.

Figure 1B:
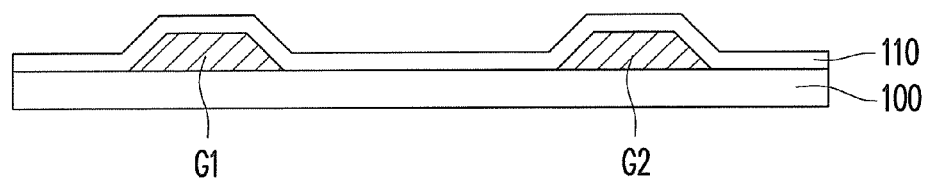

In FIG. 1B, a gate insulator 110 is formed on the substrate 100 to cover the first and second gates G1 and G2. The gate insulator 110 of this embodiment is, for instance, made of silicon oxide, silicon nitride, a silicon oxide/silicon nitride stacked layer, or other appropriate dielectric materials. Note that fabrication of the gate insulator 110 and fabrication of a gate insulator on the TFT array substrate can be integrated.

Figure 1C:
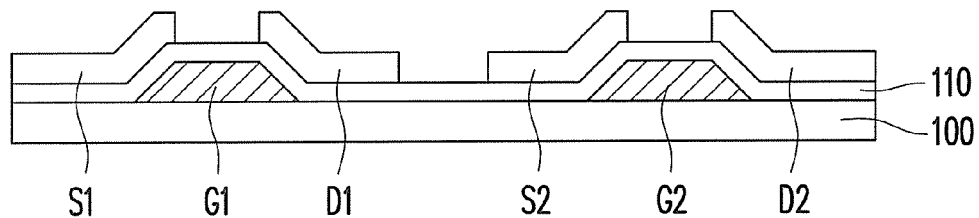

With reference to FIG. 1C, a first source S1, a first drain D1, a second source S2, and a second drain D2 are formed on the gate insulator 110. The first source S1 and the first drain D1 are located above the first gate G1. The second source S2 and the second drain D2 are located above the second gate G2. In this embodiment, the first source S1, the first drain D1, the second source S2, and the second drain D2 are formed by one photolithography and etching process, and the etchant is, for instance, $Cl_2/O_2$, $SF_6$, or $BCl_3/Cl_2$. Besides, the first source S1, the first drain D1, the second source S2, and the second drain D2 are, for instance, a Mo metal layer or a Ti/Al/Ti metal stacked layer. Certainly, the first source S1, the first drain D1, the second source S2, and the second drain D2 can be formed by other single-layered or multi-layered conductive materials in this invention. Note that fabrication of the first source S1, the first drain D1, the second source S2, and the second drain D2 and fabrication of the sources, the drains, the data lines, and/or the capacitor electrodes on the TFT array substrate can be integrated.

Figure 1D:
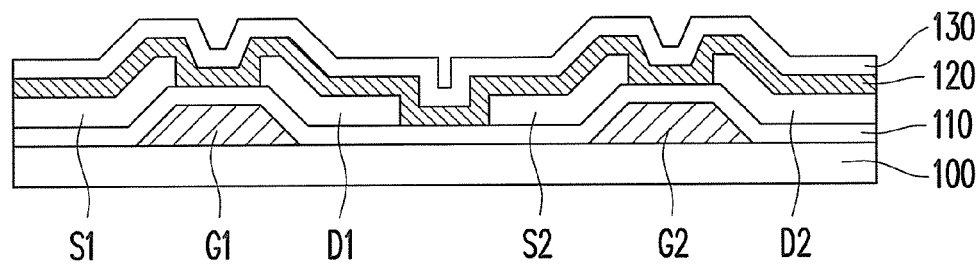
Figure 1E:
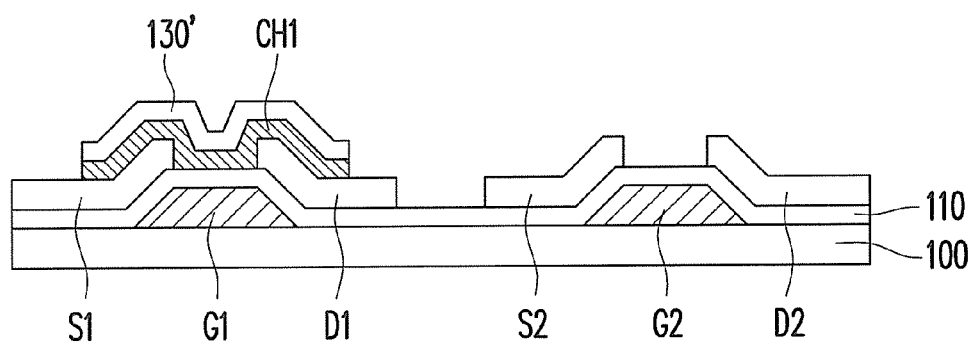

As indicated in FIG. 1D and FIG. 1E, a first channel material layer 120 and a mask material layer 130 are sequentially formed on the gate insulator 110, the first source S1, the first drain D1, the second source S2, and the second drain D2. The mask material layer 130 and the first channel material layer 120 are then patterned to form the mask layer 130' and the first channel layer CH1 In this embodiment, the mask material layer 130 and the mask layer 130' are made of silicon oxide or other appropriate dielectric materials, for instance. According to an embodiment of the invention, the material of the mask material layer 130 and the mask layer 130' is, for example, low temperature silicon oxide ($SiO_2$) (<200° C.), and the etchant used for etching the mask material layer 130 is, for example, hydrofluoric acid (HF), $CF_4/O_2$, or $SF_6/O_2$. The etchant used for etching the first channel material layer 120 is oxalic acid, for instance.

It can be observed from FIG. 1E that the mask layer 130' is located on the first channel layer CH1, and the first channel layer CH1 is located above the first gate G1 and is in contact with the first source S1 and the first drain D1. The first channel layer CH1 and the mask layer 130' have substantially the same patterns in this embodiment. That is to say, a stacked structure formed by the first channel layer CH1 and the mask layer 130' can have a vertical sidewall or a tapered sidewall. In this embodiment, the first channel layer CH1 is made of an n-type oxide semiconductor or a p-type oxide semiconductor, for instance. The n-type oxide semiconductor is indium gallium zinc oxide (IGZO), zinc oxide (ZnO), and so on, and the p-type oxide semiconductor is tin oxide (SnO), tin dioxide ($SnO_2$), and so on. In addition, the first channel layer CH1 can also be made of an inorganic semiconductor or an organic semiconductor. The organic semiconductor of this embodiment is, for instance, made of p-type pentacene, tetracene, α,ω-Dihexylsexithiophene (DH-6T), or n-type poly(benz-imidazobenzophenanthroline) (BBL), N,N'-Dioctyl-3,4,9,10-perylenedicarboximide (PTCDI-C8). The inorganic semiconductor of this embodiment is, for instance, made of IGZO, indium zinc oxide (IZO), indium gallium oxide (IGO), ZnO, $2CdO.GeO_2$, nickel cobalt oxide ($NiCo_2O_4$), and so forth.

In an embodiment of the invention, the mask layer 130' can cover a top surface of the first channel layer CH1, so as to reduce the probability of the first channel layer CH1 contacting the subsequently formed thin film and to further guarantee the reliability and favorable electrical characteristics of the CMOS transistor device.

Figure 1F:
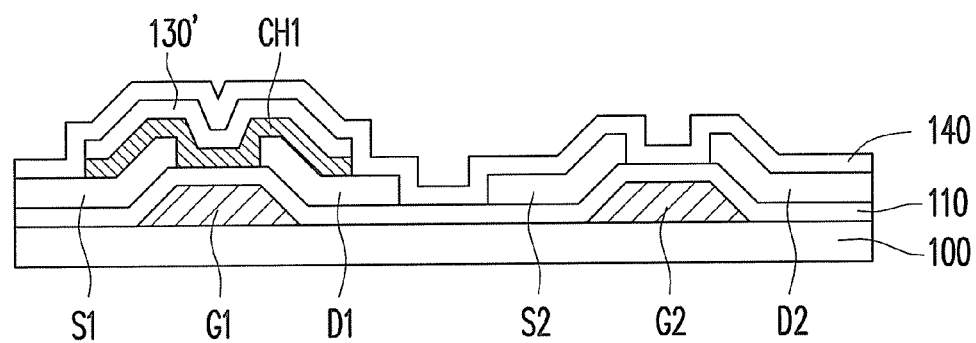

As shown in FIG. 1F, a second channel material layer 140 is formed on the mask layer 130', the first channel layer CH1, the gate insulator 110, the first source S1, the first drain D1, the second source S2, and the second drain D2. The mask layer 130' merely exposes the sidewall of the first channel layer CH1, and undercut phenomenon exists at the sidewall of the first channel layer CH1 because of the etching process. Hence, a contact area between the subsequently formed second channel material layer 140 and the sidewall of the first channel layer CH1 is not significant. Besides, when the second channel material layer 140 is etched to form the second channel layer CH2, the first channel layer CH1 that is in contact with the second channel material layer 140 is removed because of the over-etch phenomenon. As such, the dimension of the first channel layer CH1 is reduced, while the electrical characteristics of the first channel layer CH1 are not affected thereby. Note that the top surface of the first channel layer CH1 is covered by the mask layer 130' and well-protected.

Figure 1G:
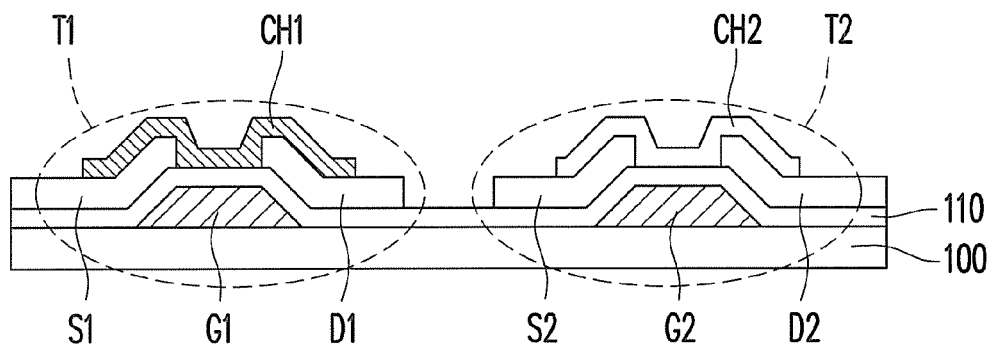

With reference to FIG. 1G, the second channel material layer 140 is patterned to form the second channel layer CH2. The second channel layer CH2 is located above the second gate G2 and is in contact with the second source S2 and the second drain D2. It can be learned from FIG. 1G that the second channel layer CH2 does not are in contact with the first channel layer CH1. In this embodiment, after the second channel layer CH2 is formed, the mask layer 130' covering the first channel layer CH1 can be further removed to expose the first channel layer CH1.

When the first channel layer CH1 is made of the n-type oxide semiconductor, the second channel layer CH2 is made of the p-type oxide semiconductor. On the contrary, when the first channel layer CH1 is made of the p-type oxide semiconductor, the second channel layer CH2 is made of the n-type oxide semiconductor. For instance, the n-type oxide semiconductor is IGZO, ZnO, and so on, and the p-type oxide semiconductor is SnO, $SnO_2$, and so on. In addition, when the first channel layer CH1 is made of the inorganic semiconductor, the second channel layer CH2 is made of the organic semiconductor. On the contrary, when the first channel layer CH1 is made of the organic semiconductor, the second channel layer CH2 is made of the inorganic semiconductor.

Note that fabrication of the first channel layer CH1 or the second channel layer CH2 and fabrication of the channel layer on the TFT array substrate can be integrated. After the second channel layer CH2 is completely made, the CMOS transistor having the p-type and n-type transistors T1 and T2 is initially formed.

Figure 1H:
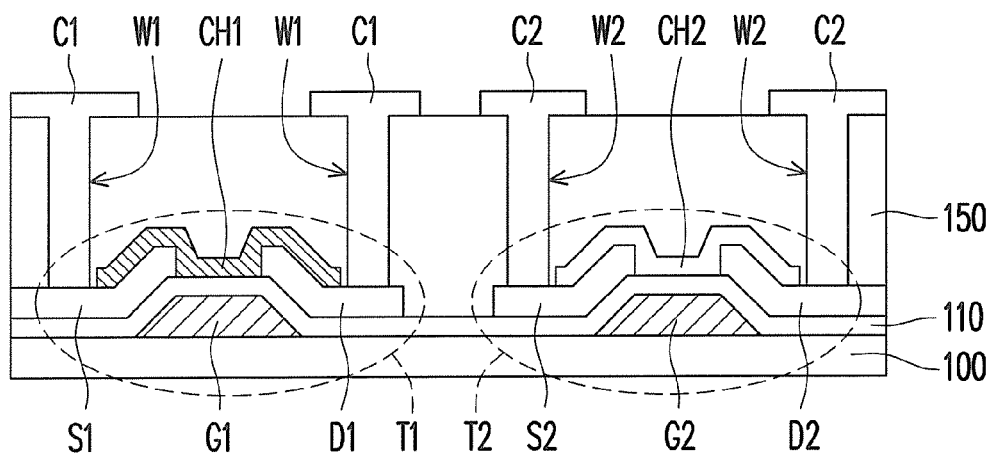

With reference to FIG. 1H, to protect the transistors T1 and T2, a passivation layer 150 can be selectively formed in this embodiment to cover the first channel layer CH1, the second channel layer CH2, the gate insulator 110, the first source S1, the first drain D1, the second source S2, and the second drain D2. The passivation layer 150 is patterned to form a plurality of first contact holes W1 and a plurality of second contact holes W2 in the passivation layer 150. The first contact holes W1 expose the first source S1 and the first drain D1, and the second contact holes W2 expose the second source S2 and the second drain D2. After the first contact holes W1 and the second contact holes W2 are formed, a plurality of first contact conductors C1 and a plurality of second contact conductors C2 are formed on the passivation layer 150. The first contact conductors C1 are electrically connected to the first source S1 and the first drain D1 through the first contact holes W1, and the second contact conductors C2 are electrically connected to the second source S2 and the second drain D2 through the second contact holes W2. Note that fabrication of the passivation layer 150 and fabrication of the passivation layer on the TFT array substrate can be integrated; fabrication of the first and second contact conductors C1 and C2 and fabrication of the pixel electrodes on the TFT array substrate can be integrated.

Second Embodiment

Figure 2A:
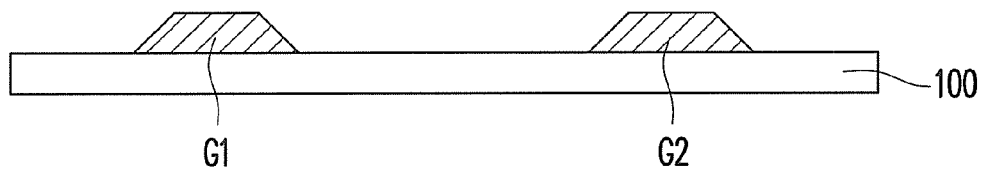
FIG. 2A to FIG. 2H are schematic cross-sectional views showing a process of fabricating a CMOS transistor according to a second embodiment of the invention.
Figure 2B:
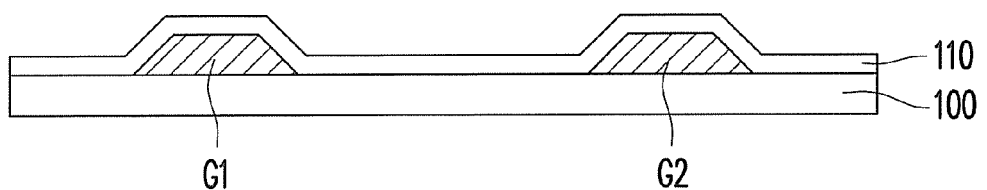
Figure 2C:
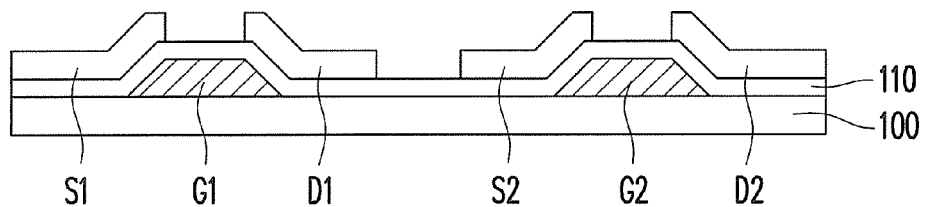
Figure 2D:
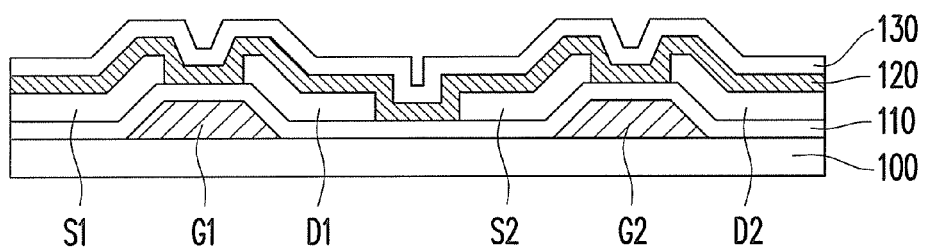
Figure 2E:
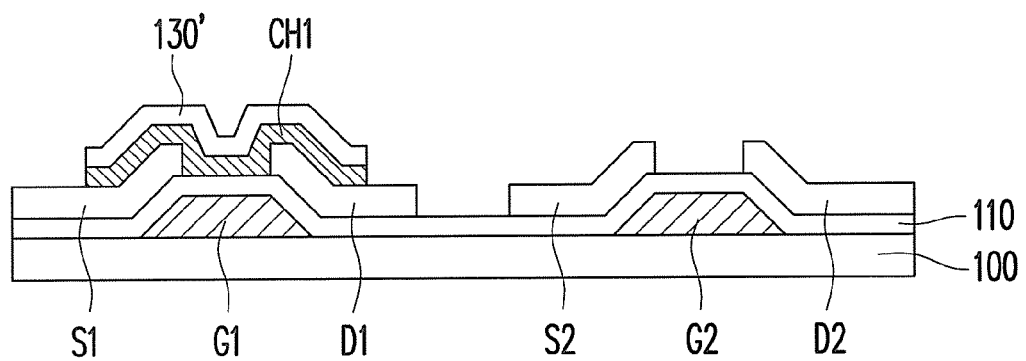
Figure 2F:
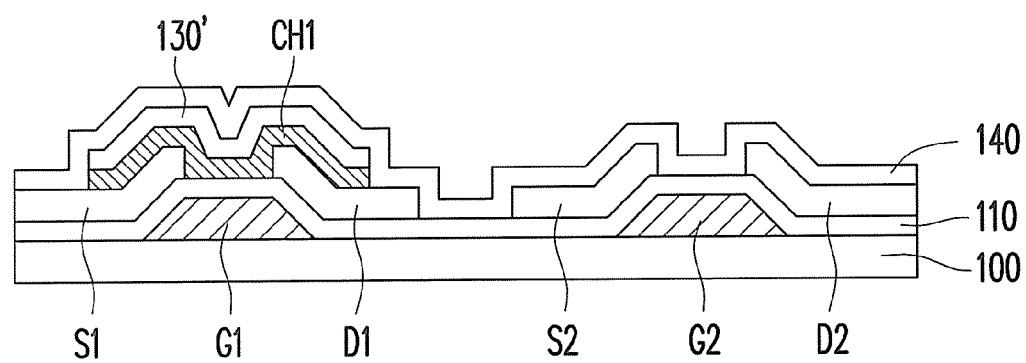
Figure 2G:
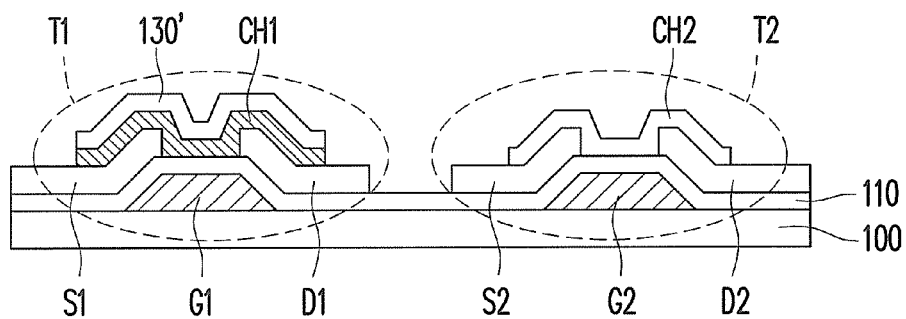
Figure 2H:
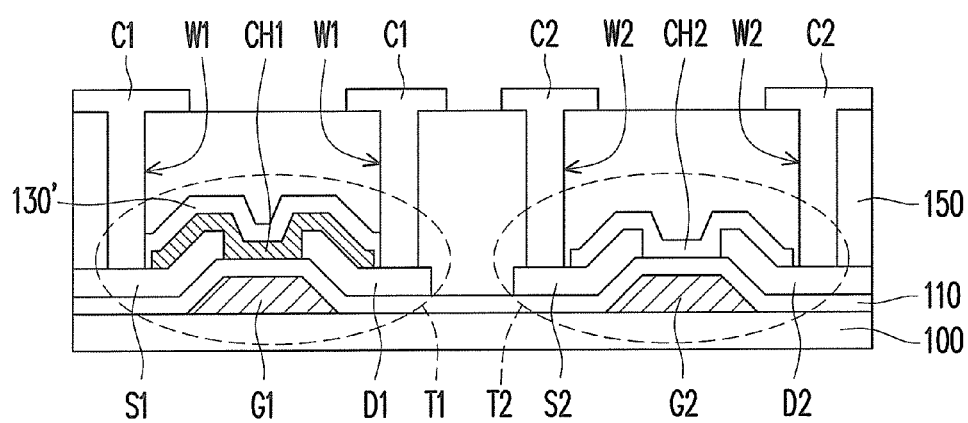

FIG. 2A to FIG. 2H are schematic cross-sectional views showing a process of fabricating a CMOS transistor according to a second embodiment of the invention. With reference to FIG. 1A to FIG. 1H and FIG. 2A to FIG. 2H, the fabricating method of the CMOS transistor in this embodiment is similar to that described in the first embodiment, while the main difference therebetween lies in that the mask layer 130' covering the first channel layer CH1 is not removed after the second channel layer CH2 is formed in this embodiment, as indicated in FIG. 2G and FIG. 2H.

With reference to FIG. 2H, the CMOS transistor of this embodiment has the mask layer 130'. Specifically, the CMOS transistor of this embodiment includes a substrate 100, a first gate G1, a second gate G2, a gate insulator 110, a first source 51, a first drain D1, a second source S2, a second drain D2, a first channel layer CH1, the mask layer 130', and a second channel layer CH2. The first gate G1 and the second gate G2 are disposed on the substrate 100. The gate insulator 110 is disposed on the substrate 100 to cover the first gate G1 and the second gate G2. The first source S1, the first drain D1, the second source S2, and the second drain D2 are disposed on the gate insulator 110. The first source S1 and the first drain D1 are located above the first gate G1. The second source S2 and the second drain D2 are located above the second gate G2. The first channel layer CH1 is disposed on the gate insulator 110, and the mask layer 130' is disposed on the first channel layer CH1. The first channel layer CH1 is located above the first gate G1 and is in contact with the first source S1 and the first drain D1. The second channel layer CH2 is disposed on the gate insulator 110. Besides, the second channel layer CH2 is located above the second gate G2 and is in contact with the second source S2 and the second drain D2.

In this embodiment, the mask layer 130' can cover a top surface of the first channel layer CH1 to reduce the probability of the first channel layer CH1 coming into contact with the subsequently formed thin film and mitigate the impact on the first channel layer CH1 because of the etching process of the second channel layer CH2. Thereby, the reliability and favorable electrical characteristics of the CMOS transistor device can be guaranteed.

Third Embodiment

Figure 3A:
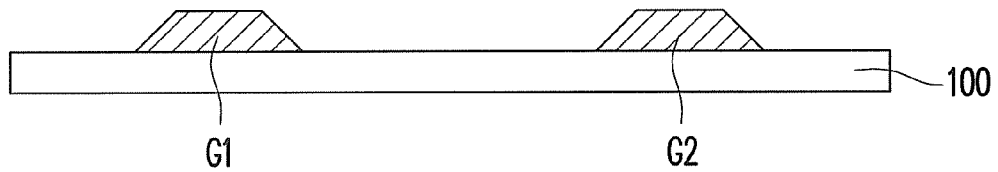
FIG. 3A to FIG. 3G are schematic cross-sectional views showing a process of fabricating a CMOS transistor according to a third embodiment of the invention.

FIG. 3A to FIG. 3G are schematic cross-sectional views showing a process of fabricating a CMOS transistor according to a third embodiment of the invention. As shown in FIG. 3A, a first gate G1 and a second gate G2 are formed on a substrate 100. In this embodiment, the first gate G1 and the second gate G2 are formed by one photolithography and etching process, and the etchant is, for instance, $Cl_2/O_2$, $SF_6$, or $BCl_3/Cl_2$. Besides, the first gate G1 and the second gate G2 are, for instance, a Mo metal layer or a Ti/Al/Ti metal stacked layer. Certainly, the first gate G1 and the second gate G2 can be formed by other single-layered or multi-layered conductive materials in this invention. Note that fabrication of the first and second gates G1 and G2 and fabrication of the gates, the scan lines, and/or the common wires on the TFT array substrate can be integrated.

Figure 3B:
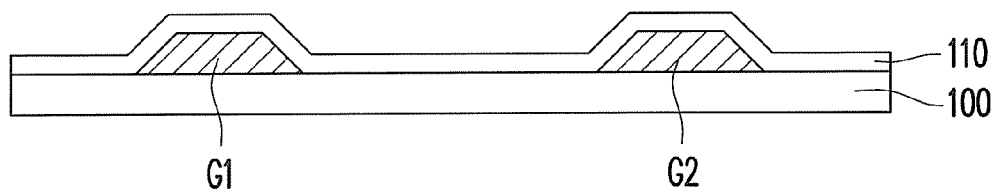

In FIG. 3B, a gate insulator 110 is formed on the substrate 100 to cover the first and second gates G1 and G2. The gate insulator 110 of this embodiment is, for instance, made of silicon oxide, silicon nitride, a silicon oxide/silicon nitride stacked layer, or other appropriate dielectric materials. Note that fabrication of the gate insulator 110 and fabrication of the gate insulator on the TFT array substrate can be integrated.

Figure 3C:
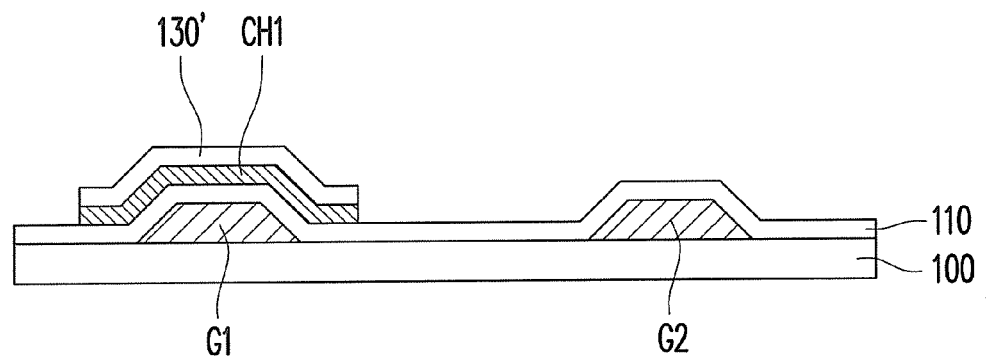

As indicated in FIG. 3C, a first channel material layer and a mask material layer (not shown) are sequentially formed on the gate insulator 110, and the mask material layer and the first channel material layer are patterned to form the mask layer 130' and the first channel layer CH1. In this embodiment, the mask layer 130' is made of silicon oxide or other appropriate dielectric materials, for instance. According to an embodiment of the invention, the material of the mask material layer 130 and the mask layer 130' is, for example, low temperature silicon oxide $SiO_2$ (<200° C.), and the etchant used for etching the mask material layer 130 is, for example, HF, $CF_4/O_2$, or $SF_6/O_2$. The etchant used for etching the first channel material layer is oxalic acid, for instance.

The first channel layer CH1 and the mask layer 130' have substantially the same patterns in this embodiment. That is to say, a stacked structure formed by the first channel layer CH1 and the mask layer 130' can have a vertical sidewall or a tapered sidewall. In this embodiment, the first channel layer CH1 is made of an n-type oxide semiconductor or a p-type oxide semiconductor, for instance. For instance, the n-type oxide semiconductor is IGZO, ZnO, and so on, and the p-type oxide semiconductor is SnO, $SnO_2$, and so on. In addition, the first channel layer CH1 can also be made of an inorganic semiconductor or an organic semiconductor. The organic semiconductor of this embodiment is, for instance, made of p-type pentacene, tetracene, α,ω-Dihexylsexithiophene (DH-6T), or n-type poly(benzimidazobenzophenanthroline) (BBL), N,N'-Dioctyl-3,4,9,10-perylenedicarboximide (PTCDI-C8). The inorganic semiconductor of this embodiment is, for instance, made of IGZO, IZO, IGO, ZnO, $2CdO.GeO_2$, $NiCo_2O_4$, and so forth.

In this embodiment of the invention, the mask layer 130' can cover a top surface of the first channel layer CH1, so as to reduce the contact area between the first channel layer CH1 and the subsequently formed thin film and to further guarantee the reliability and favorable electrical characteristics of the CMOS transistor device.

Figure 3D:
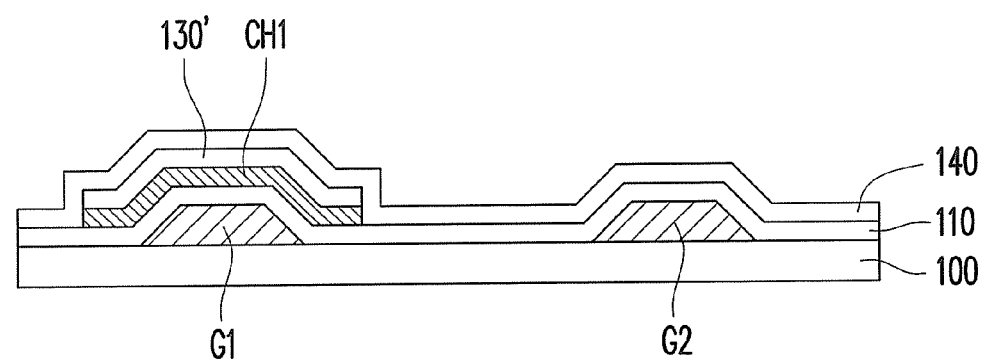

As shown in FIG. 3D, a second channel material layer 140 is formed on the mask layer 130', the first channel layer CH1, and the gate insulator 110. Note that the mask layer 130' is sandwiched between the first channel layer CH1 and the second channel material layer 140, and therefore the contact area between the first channel layer CH1 and the second channel material layer 140 is insignificant. Hence, the first channel layer CH1 and the second channel material layer 140 are not apt to affect each other. As such, the electrical characteristics of the first channel layer CH1 are not prone to changes caused by the second channel material layer 140.

Figure 3E:
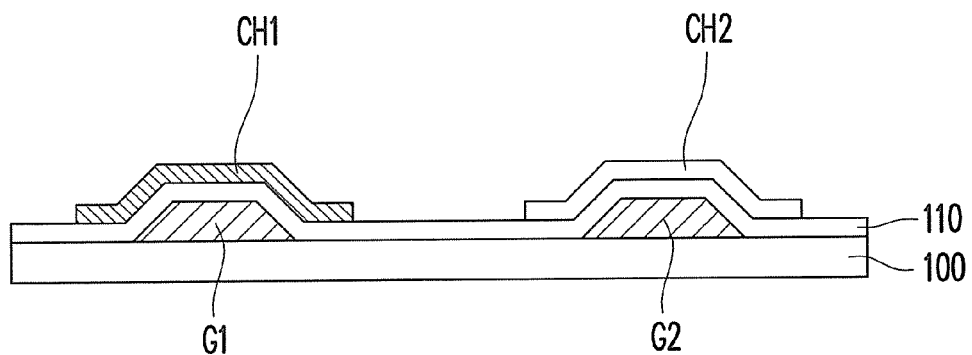

With reference to FIG. 3E, the second channel material layer 140 is patterned to form the second channel layer CH2, and the mask layer 130' is removed to expose the first channel layer CH1. The second channel layer CH2 is located above the second gate G2, and the second channel layer CH2 does not are in contact with the first channel layer CH1.

When the first channel layer CH1 is made of the n-type oxide semiconductor, the second channel layer CH2 is made of the p-type oxide semiconductor. On the contrary, when the first channel layer CH1 is made of the p-type oxide semiconductor, the second channel layer CH2 is made of the n-type oxide semiconductor. For instance, the n-type oxide semiconductor is IGZO, ZnO, and so on, and the p-type oxide semiconductor is SnO, $SnO_2$, and so on. In addition, when the first channel layer CH1 is made of the inorganic semiconductor, the second channel layer CH2 is made of the organic semiconductor. On the contrary, when the first channel layer CH1 is made of the organic semiconductor, the second channel layer CH2 is made of the inorganic semiconductor.

Note that fabrication of the first channel layer CH1 or the second channel layer CH2 and fabrication of the channel layer on the TFT array substrate can be integrated.

Figure 3F:
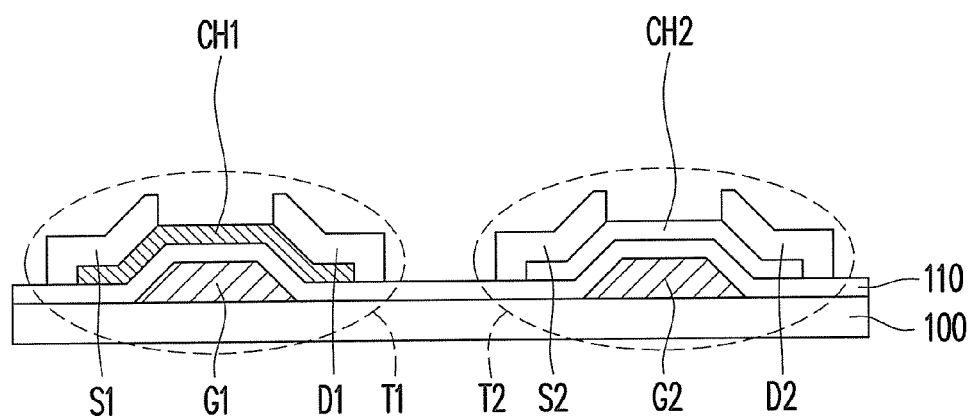

In FIG. 3F, a first source S1, a first drain D1, a second source S2, and a second drain D2 are formed. The first source S1 and the first drain D1 are in contact with the first channel layer CH1, and the second source S2 and the second drain D2 are in contact with the second channel layer CH2. In this embodiment, the first source S1, the first drain D1, the second source S2, and the second drain D2 are formed by one photolithography and etching process, and the etchant is, for instance, $Cl_2/O_2$, $SF_6$, or $BCl_3/Cl_2$. Besides, the first source S1, the first drain D1, the second source S2, and the second drain D2 are, for instance, a Mo metal layer or a Ti/Al/Ti metal stacked layer. Certainly, the first source S1, the first drain D1, the second source S2, and the second drain D2 can be formed by other single-layered or multi-layered conductive materials in this invention. Note that fabrication of the first source S1, the first drain D1, the second source S2, and the second drain D2 and fabrication of the sources, the drains, the data lines, and/or the capacitor electrodes on the TFT array substrate can be integrated. After the first source S1, the first drain D1, the second source S2, and the second drain D2 are completely made, the CMOS transistor having the p-type and n-type transistors T1 and T2 is initially formed.

Figure 3G:
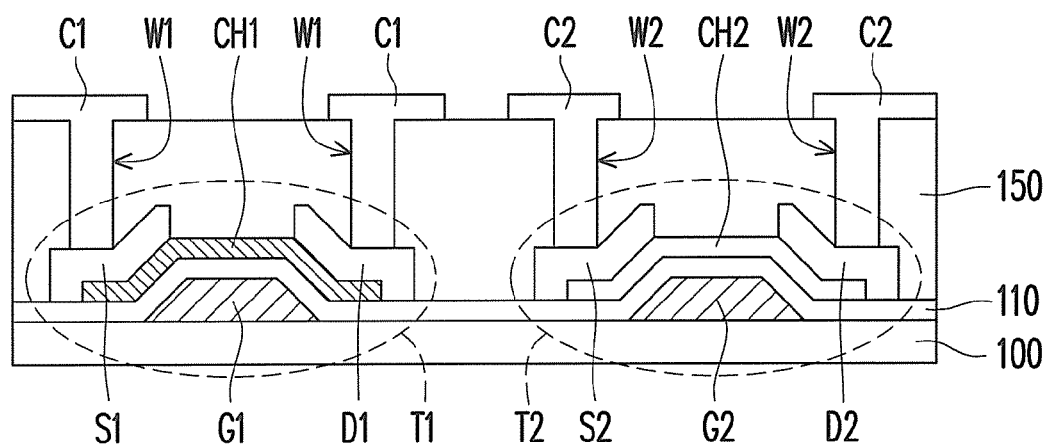

With reference to FIG. 3G, to protect the transistors T1 and T2, a passivation layer 150 can be selectively formed in this embodiment to cover the first channel layer CH1, the second channel layer CH2, the gate insulator 110, the first source S1, the first drain D1, the second source S2, and the second drain D2. The passivation layer 150 is patterned to form a plurality of first contact holes W1 and a plurality of second contact holes W2 in the passivation layer 150. The first contact holes W1 expose the first source S1 and the first drain D1, and the second contact holes W2 expose the second source S2 and the second drain D2. After the first contact holes W1 and the second contact holes W2 are formed, a plurality of first contact conductors C1 and a plurality of second contact conductors C2 are formed on the passivation layer 150. The first contact conductors C1 are electrically connected to the first source S1 and the first drain D1 through the first contact holes W1, and the second contact conductors C2 are electrically connected to the second source S2 and the second drain D2 through the second contact holes W2. Note that fabrication of the passivation layer 150 and fabrication of the passivation layer on the TFT array substrate can be integrated; fabrication of the first and second contact conductors C1 and C2 and fabrication of the pixel electrodes on the TFT array substrate can be integrated.

Fourth Embodiment

Figure 4A:
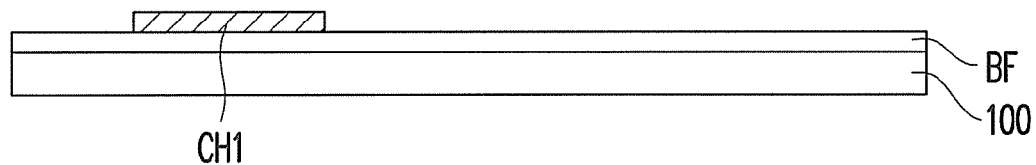
FIG. 4A to FIG. 4F are schematic cross-sectional views showing a process of fabricating a CMOS transistor according to a fourth embodiment of the invention.

FIG. 4A to FIG. 4F are schematic cross-sectional views showing a process of fabricating a CMOS transistor according to a fourth embodiment of the invention. With reference to FIG. 4A, a first channel layer CH1 is formed on a substrate 100. In this embodiment, the first channel layer CH1 is made of an n-type oxide semiconductor or a p-type oxide semiconductor, for instance. For instance, the n-type oxide semiconductor is IGZO, ZnO, and so on, and the p-type oxide semiconductor is SnO, $SnO_2$, and so on. In addition, the first channel layer CH1 can also be made of an inorganic semiconductor or an organic semiconductor. Before the first channel layer CH1 is formed, a buffer layer BF can be selectively formed on the substrate 100. The buffer layer BF, for example, is made of silicon nitride or other materials capable of blocking impurity of the substrate 100, so as to prevent the impurity from diffusing into the first channel layer CH1.

Figure 4B:
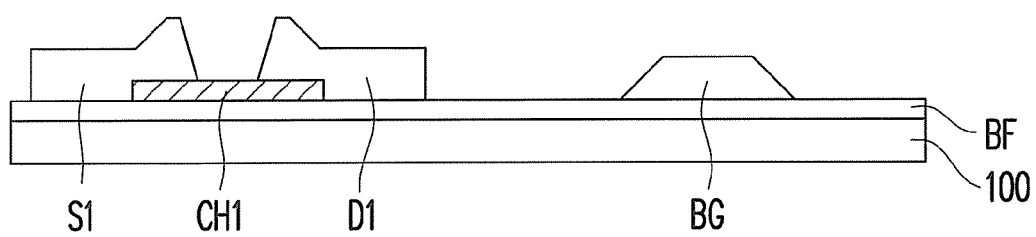

With reference to FIG. 4B, a bottom gate BG, a first source S1, and a first drain D1 are formed on the substrate 100. In this embodiment, the bottom gate BG, the first source S1, and the first drain D1 are formed by one photolithography and etching process, and the etchant is, for instance, $Cl_2/O_2$, $SF_6$, or $BCl_3/Cl_2$. Besides, the bottom gate BG, the first source S1, and the first drain D1 are, for instance, a Mo metal layer or a Ti/Al/Ti metal stacked layer. Certainly, the bottom gate BG, the first source S1, and the first drain D1 can be formed by other single-layered or multi-layered conductive materials in this invention. Note that fabrication of the bottom gate BG, the first source S1, and the first drain D1 and fabrication of the gates, the scan lines, and/or the common wires on the TFT array substrate can be integrated.

Figure 4C:
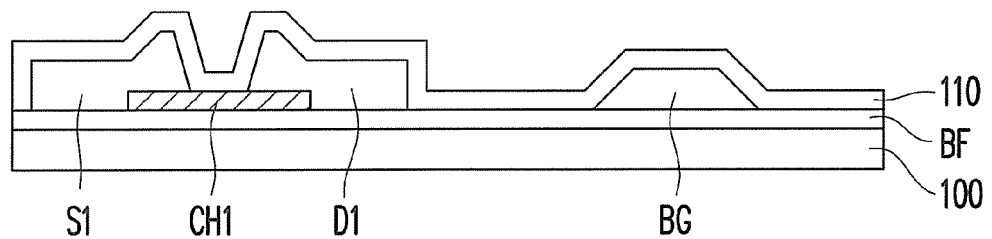

As indicated in FIG. 4C, a gate insulator 110 is formed on the substrate 100 to cover the first channel layer CH1, the bottom gate BG, the first source S1, and the first drain D1. The gate insulator 110 of this embodiment is, for instance, made of silicon oxide, silicon nitride, a silicon oxide/silicon nitride stacked layer, or other appropriate dielectric materials. Note that fabrication of the gate insulator 110 and fabrication of the gate insulator on the TFT array substrate can be integrated.

Figure 4D:
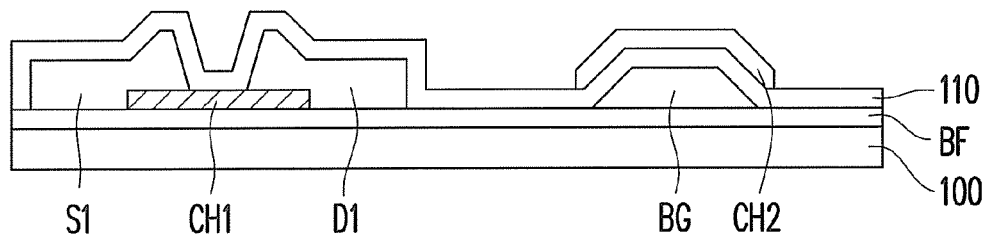

With reference to FIG. 4D, a second channel layer CH2 is formed on the gate insulator 110, and the second channel layer CH2 is located above the bottom gate BG. When the first channel layer CH1 is made of the n-type oxide semiconductor, the second channel layer CH2 is made of the p-type oxide semiconductor. On the contrary, when the first channel layer CH1 is made of the p-type oxide semiconductor, the second channel layer CH2 is made of the n-type oxide semiconductor. For instance, the n-type oxide semiconductor is IGZO, ZnO, and so on, and the p-type oxide semiconductor is SnO, $SnO_2$, and so on. In addition, when the first channel layer CH1 is made of the inorganic semiconductor, the second channel layer CH2 is made of the organic semiconductor. On the contrary, when the first channel layer CH1 is made of the organic semiconductor, the second channel layer CH2 is made of the inorganic semiconductor.

Figure 4E:
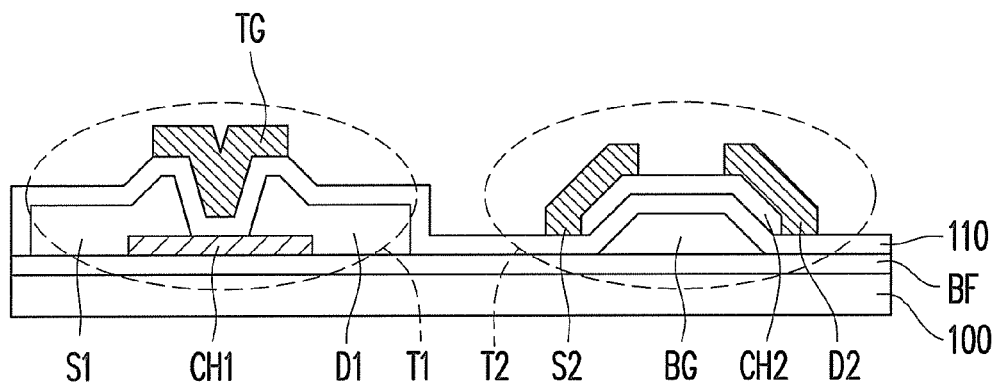

In FIG. 4E, a top gate TG, a second source S2, and a second drain D2 are formed on the gate insulator 110. The top gate TG is located above the first channel layer CH1, and the second source S2 and the second drain D2 are in contact with the second channel layer CH2. In this embodiment, the top gate TG, the second source S2, and the second drain D2 are formed by one photolithography and etching process, and the etchant is, for instance, $Cl_2/O_2$, sulfur $SF_6$, or $BCl_3/Cl_2$. Besides, the top gate TG, the second source S2, and the second drain D2 are, for instance, a Mo metal layer or a Ti/Al/Ti metal stacked layer. Certainly, the top gate TG, the second source S2, and the second drain D2 can be formed by other single-layered or multi-layered conductive materials in this invention. Note that fabrication of the top gate TG, the second source S2, and the second drain D2 and fabrication of the sources, the drains, the data lines, and/or the capacitor electrodes on the TFT array substrate can be integrated.

After the top gate TG, the second source S2, and the second drain D2 are completely made, the CMOS transistor having the p-type and n-type transistors T1 and T2 is initially formed.

Figure 4F:
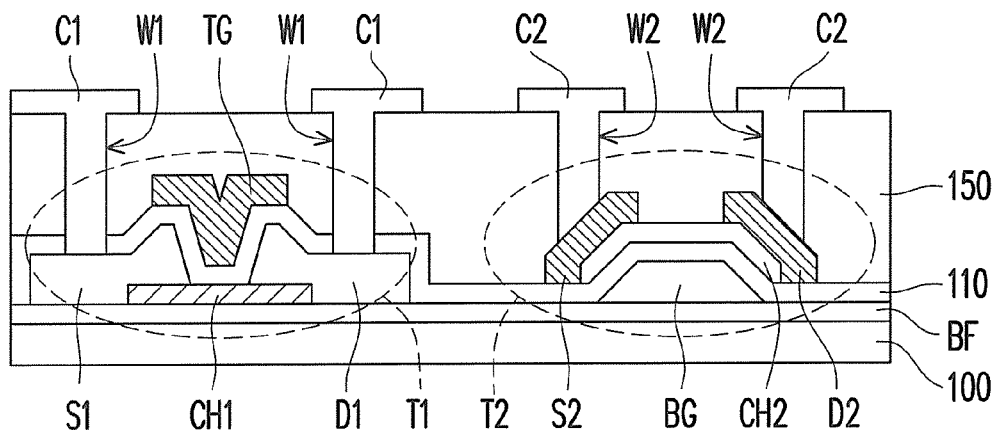

With reference to FIG. 4F, to protect the transistors T1 and T2, a passivation layer 150 can be selectively formed in this embodiment to cover the second channel layer CH2, the gate insulator 110, the second source S2, the second drain D2, and the top gate TG. The passivation layer 150 is patterned to form a plurality of first contact holes W1 in the passivation layer 150 and the gate insulator 110 and form a plurality of second contact holes W2 in the passivation layer 150. The first contact holes W1 expose the first source S1 and the first drain D1, and the second contact holes W2 expose the second source S2 and the second drain D2. After the first contact holes W1 and the second contact holes W2 are formed, a plurality of first contact conductors C1 and a plurality of second contact conductors C2 are formed on the passivation layer 150. The first contact conductors C1 are electrically connected to the first source S1 and the first drain D1 through the first contact holes W1, and the second contact conductors C2 are electrically connected to the second source S2 and the second drain D2 through the second contact holes W2. Note that fabrication of the passivation layer 150 and fabrication of the passivation layer on the TFT array substrate can be integrated; fabrication of the first and second contact conductors C1 and C2 and fabrication of the pixel electrodes on the TFT array substrate can be integrated. In this fourth embodiment, the first channel layer CH1 is formed before the first source S1 and the first drain D1 are formed, and the second channel layer CH2 is formed before the second source S2 and the second drain D2 are formed. However, the invention is not limited thereto. In another embodiment, the first channel layer CH1 is formed before the first source S1 and the first drain D1 are formed, and the second channel layer CH2 is formed after the second source S2 and the second drain D2 are formed.

Fifth Embodiment

Figure 5A:
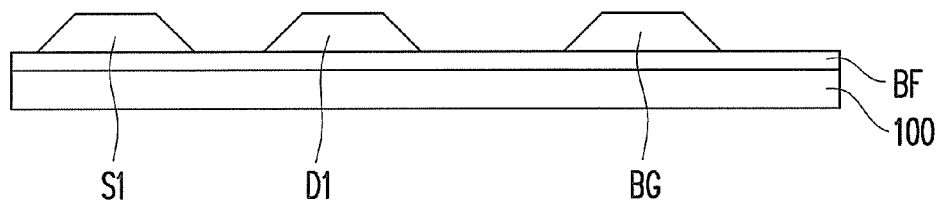
FIG. 5A to FIG. 5E are schematic cross-sectional views showing a process of fabricating a CMOS transistor according to a fifth embodiment of the invention.
Figure 5B:
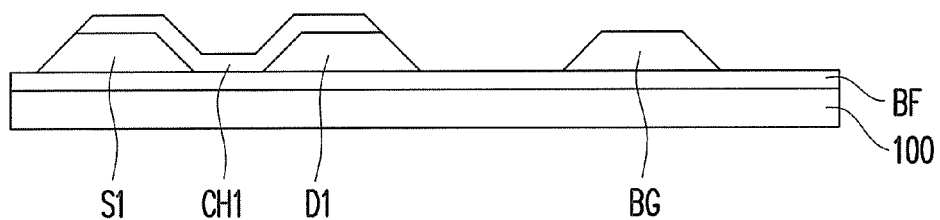
Figure 5C:
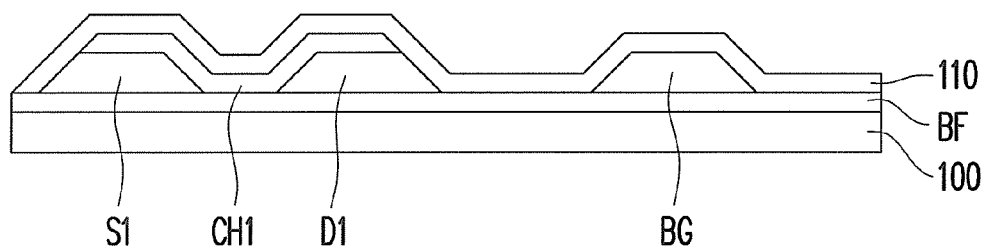
Figure 5D:
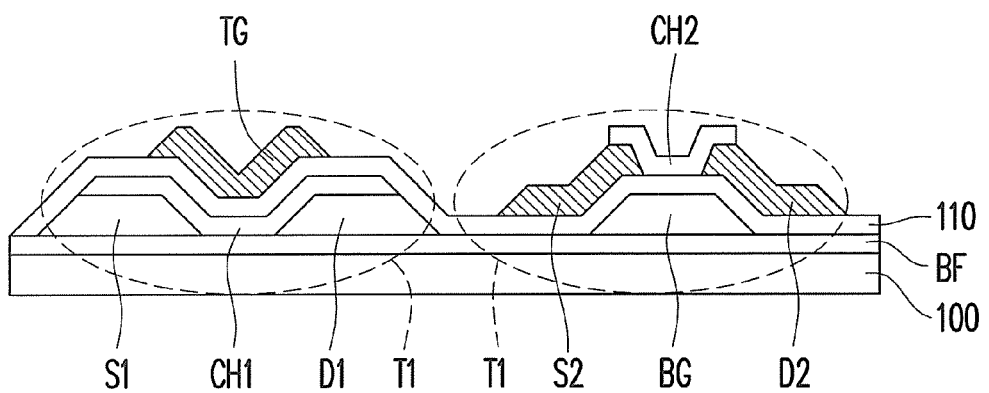
Figure 5E:
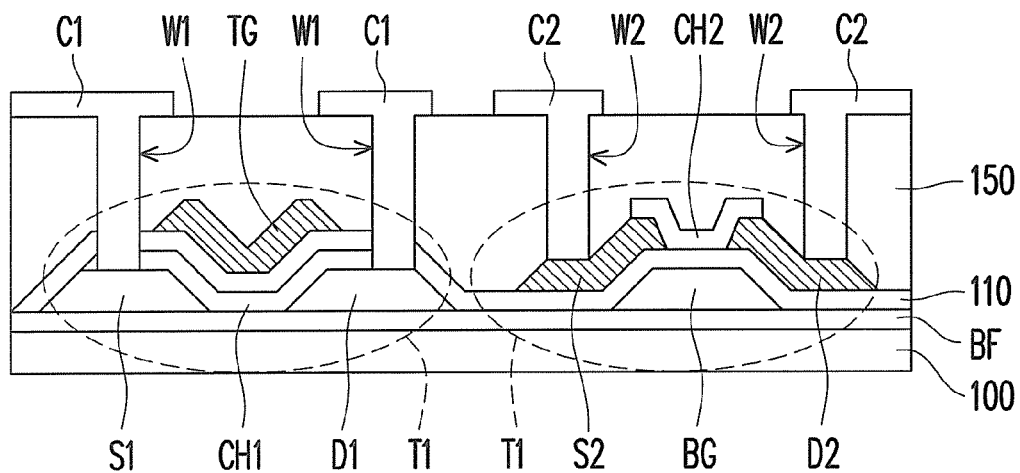

FIG. 5A to FIG. 5E are schematic cross-sectional views showing a process of fabricating a CMOS transistor according to a fifth embodiment of the invention. With reference to FIG. 4A to FIG. 4F and FIG. 5A to FIG. 5E, this embodiment is similar to the fourth embodiment, while the main difference therebetween lies in the order of forming the first channel layer CH1, the bottom gate BG, the first source S1, and the first drain D1. In particular, in the fourth embodiment, the first channel layer CH1 is formed before the first source S1 and the first drain D1 are formed, and the second channel layer CH2 is formed before the second source S2 and the second drain D2 are formed. By contrast, in this embodiment, the first channel layer CH1 is formed after the first source S1 and the first drain D1 are formed, and the second channel layer CH2 is formed after the second source S2 and the second drain D2 are formed. The difference between this embodiment (as shown in FIG. 5A and FIG. 5B) and the fourth embodiment is described below, while the other steps as shown in FIG. 5C to FIG. 5E are not repeated herein.

With reference to FIG. 5A, a bottom gate BG, a first source S1, and a first drain D1 are formed on a substrate 100. In this embodiment, before the bottom gate BG, the first source S1, and the first drain D1 are formed, a buffer layer BF can be selectively formed on the substrate 100. The buffer layer BF is made of silicon nitride or other materials capable of blocking impurity of the substrate 100, for instance.

In FIG. 5B, a first channel layer CH1 is formed on the substrate 100, and the first channel layer CH1 is in contact with a portion of the first source S1 and a portion of the first drain D1.

The mutual influence between the n-type semiconductor layer and the p-type semiconductor layer can be effectively prevented by using the mask layer in the manufacturing process according to the invention, and therefore reliability and favorable electrical characteristics of the CMOS transistor device can be guaranteed in this invention. In addition, the fabricating process described in this invention is compatible with the fabricating process of the existing TFT array substrate.

It will be apparent to those skilled in the art that various modifications and variations can be made to the structure of the invention without departing from the scope or spirit of the invention. In view of the foregoing, it is intended that the invention cover modifications and variations of the invention provided they fall within the scope of the following claims and their equivalents.

What is claimed is:

1. A fabricating method of a complementary metal oxide semiconductor transistor, comprising:
    forming a first gate and a second gate on a substrate;
    forming a gate insulator on the substrate to cover the first gate and the second gate;
    forming a first source, a first drain, a second source, and a second drain on the gate insulator, wherein the first source and the first drain are located above the first gate, and the second source and the second drain are located above the second gate;
    forming a first channel layer and a mask layer on the gate insulator, wherein the mask layer is located on the first channel layer, and the first channel layer is located above the first gate and is in contact with the first source and the first drain; and
    forming a second channel layer on the gate insulator, wherein the second channel layer is located above the second gate and is in contact with the second source and the second drain, and the method of forming the second channel layer comprises forming a second channel material layer on the mask layer, the first channel layer, the gate insulator, the first source, the first drain, the second source, and the second drain, and patterning the second channel material layer.

2. The fabricating method as claimed in claim 1, wherein the first gate and the second gate are formed by one photolithography and etching process.

3. The fabricating method as claimed in claim 1, wherein the first source, the first drain, the second source, and the second drain are formed by one photolithography and etching process.

4. The fabricating method as claimed in claim 1, wherein a method of forming the first channel layer and the mask layer comprises:
    sequentially forming a first channel material layer and a mask material layer on the gate insulator, the first source, the first drain, the second source, and the second drain; and
    patterning the mask material layer and the first channel material layer to form the mask layer and the first channel layer.

5. The fabricating method as claimed in claim 1, further comprising removing the mask layer after forming the second channel layer.

6. The fabricating method as claimed in claim 5, further comprising:
    forming a passivation layer, the passivation layer covering the first channel layer, the second channel layer, the gate insulator, the first source, the first drain, the second source, and the second drain;
    patterning the passivation layer to form a plurality of first contact holes and a plurality of second contact holes in the passivation layer, wherein the first contact holes expose the first source and the first drain, and the second contact holes expose the second source and the second drain; and
    forming a plurality of first contact conductors and a plurality of second contact conductors on the passivation layer, wherein the first contact conductors are electrically connected to the first source and the first drain through the first contact holes, and the second contact conductors are electrically connected to the second source and the second drain through the second contact holes.

7. The fabricating method as claimed in claim 1, wherein a material of the first channel layer comprises an n-type oxide semiconductor, and a material of the second channel layer comprises a p-type oxide semiconductor.

8. The fabricating method as claimed in claim 1, wherein a material of the first channel layer comprises a p-type oxide semiconductor, and a material of the second channel layer comprises an n-type oxide semiconductor.

9. The fabricating method as claimed in claim 1, wherein a material of the first channel layer comprises an inorganic semiconductor, and a material of the second channel layer comprises an organic semiconductor.

10. The fabricating method as claimed in claim 1, wherein a material of the first channel layer comprises an organic semiconductor, and a material of the second channel layer comprises an inorganic semiconductor.

11. The fabricating method as claimed in claim 1, further comprising:

forming a passivation layer, the passivation layer covering the mask layer, the first channel layer, the second channel layer, the gate insulator, the first source, the first drain, the second source, and the second drain.

12. The fabricating method as claimed in claim 11, further comprising:

patterning the passivation layer to form a plurality of first contact holes and a plurality of second contact holes, wherein the first contact holes expose the first source and the first drain, and the second contact holes expose the second source and the second drain; and forming a plurality of first contact conductors and a plurality of second contact conductors on the passivation layer, wherein the first contact conductors are electrically connected to the first source and the first drain through the first contact holes, and the second contact conductors are electrically connected to the second source and the second drain through the second contact holes.

* * * * *